US012813211B2

(12) United States Patent
Tian et al.

(10) Patent No.: US 12,813,211 B2
(45) Date of Patent: Nov. 24, 2026

(54) FLOATING PCB DESIGN FOR SUBSTRATE SUPPORT ASSEMBLY

(71) Applicant: LAM RESEARCH CORPORATION, Fremont, CA (US)

(72) Inventors: Siyuan Tian, Newark, CA (US); Yuma Ohkura, San Mateo, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 890 days.

(21) Appl. No.: 17/920,111

(22) PCT Filed: Apr. 6, 2021

(86) PCT No.: PCT/US2021/025848
§ 371 (c)(1),
(2) Date: Oct. 20, 2022

(87) PCT Pub. No.: WO2021/216275
PCT Pub. Date: Oct. 28, 2021

(65) Prior Publication Data

US 2023/0178407 A1 Jun. 8, 2023

Related U.S. Application Data

(60) Provisional application No. 63/014,893, filed on Apr. 24, 2020.

(51) Int. Cl.
*H10P 72/72* (2026.01)
*H01J 37/32* (2006.01)

(52) U.S. Cl.
CPC ...... *H10P 72/722* (2026.01); *H01J 37/32724* (2013.01); *H01J 2237/3321* (2013.01); *H01J 2237/334* (2013.01)

(58) Field of Classification Search
None
See application file for complete search history.

(56) References Cited

U.S. PATENT DOCUMENTS

2002/0190051 A1 12/2002 Wang et al.
2008/0016684 A1 * 1/2008 Olechnowicz .......... C03C 3/062 29/748
2014/0231389 A1 8/2014 Nagami et al.
2015/0170882 A1 6/2015 Yamawaku et al.
2016/0035544 A1 2/2016 Lubomirsky et al.
(Continued)

FOREIGN PATENT DOCUMENTS

JP 2008085283 A 4/2008
JP 2013543269 A 11/2013
(Continued)

OTHER PUBLICATIONS

International Search Report and Written Opinion of the ISA issued in PCT/US2021/025848, mailed Jul. 26, 2021; ISA/KR.
(Continued)

*Primary Examiner* — Jeffrie R Lund
*Assistant Examiner* — Tiffany Z Nuckols

(57) ABSTRACT

A substrate support assembly includes a baseplate to support at least one layer to be disposed thereon and a first printed circuit board coupled to the baseplate by a plurality of mounting assemblies that allow the baseplate to move relative to the first printed circuit board.

19 Claims, 6 Drawing Sheets

(56) References Cited

U.S. PATENT DOCUMENTS

| | | | | |
|---|---|---|---|---|
| 2017/0098564 | A1 | 4/2017 | Pape et al. | |
| 2019/0348263 | A1* | 11/2019 | Okunishi | H01F 27/02 |
| 2020/0027700 | A1 | 1/2020 | Kim et al. | |
| 2020/0066557 | A1 | 2/2020 | Lee et al. | |
| 2021/0313202 | A1* | 10/2021 | Takahashi | H01J 37/32724 |

FOREIGN PATENT DOCUMENTS

| | | | |
|---|---|---|---|
| JP | 2014186994 | A | 10/2014 |
| JP | 2015115216 | A | 6/2015 |
| JP | 2017143057 | A | 8/2017 |
| JP | 2017522737 | A | 8/2017 |
| KR | 20010032700 | A | 4/2001 |
| KR | 1020120103596 | A | 9/2012 |
| KR | 20140070494 | A | 6/2014 |
| KR | 20160006693 | A | 1/2016 |
| KR | 1020200023987 | A | 3/2020 |

OTHER PUBLICATIONS

Japanese Office Action for Japanese Application No. 2022-564198 dated Feb. 25, 2025.

Korean Office Action for Korean Application No. 10-2022-7040231 dated Jan. 22, 2025.

Decision for Grant of Patent for Korean Application No. 10-2022-7040231 dated Jun. 15, 2026.

* cited by examiner

FLOATING PCB DESIGN FOR SUBSTRATE SUPPORT ASSEMBLY

CROSS-REFERENCE TO RELATED APPLICATIONS

This application is a U.S. National Phase Application under 35 U.S.C. 371 of International Application No. PCT/US2021/025848, filed on Apr. 6, 2021, which claims the benefit of U.S. Provisional Application No. 63/014,893, filed on Apr. 24, 2020. The entire disclosures of the applications referenced above are incorporated herein by reference.

FIELD

The present disclosure relates generally to substrate processing systems and more particularly to a floating printed circuit board (PCB) design for a substrate support assembly.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, plasma enhanced chemical vapor deposition (PECVD), chemically enhanced plasma vapor deposition (CEPVD), sputtering physical vapor deposition (PVD), atomic layer deposition (ALD), and plasma enhanced ALD (PEALD). Additional examples of processes that may be performed on a substrate include, but are not limited to, etching (e.g., chemical etching, plasma etching, reactive ion etching, etc.) and cleaning processes.

During processing, a substrate is arranged on a substrate support assembly such as a pedestal or an electrostatic chuck (ESC) arranged in a processing chamber of the substrate processing system. A robot typically transfers substrates from one processing chamber to another in a sequence in which the substrates are to be processed. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. The processing chambers are periodically cleaned by supplying a cleaning gas into the processing chamber and striking plasma.

SUMMARY

A substrate support assembly comprises a baseplate to support at least one layer to be disposed thereon and a first printed circuit board coupled to the baseplate by a plurality of mounting assemblies that allow the baseplate to move relative to the first printed circuit board.

In another feature, the mounting assemblies allow displacement of the baseplate relative to the first printed circuit board without transferring such displacement to the first printed circuit board.

In another feature, the baseplate comprises a plurality of heaters, and the mounting assemblies allow expansion of the baseplate along at least one of X, Y, and Z axes due to heat while not allowing such expansion to transfer to the first printed circuit board.

In another feature, the baseplate comprises a plurality of cooling channels, and the mounting assemblies allow contraction of the baseplate along at least one of X, Y, and Z axes due to cooling while not allowing such contraction to transfer to the first printed circuit board.

In another feature, the baseplate comprises a plurality of heaters and cooling channels, and the mounting assemblies allow displacement of the baseplate along at least one of X, Y, and Z axes due to heating and cooling while not allowing such displacement to transfer to the first printed circuit board.

In another feature, the substrate support assembly further comprises a second printed circuit board fixed to a facility plate and connected to the first printed circuit board, and the mounting assemblies allow the baseplate to move while keeping the first and second printed circuit boards stationary relative to each other.

In other features, each mounting assembly comprises a fastener, a first spacer, and a second spacer. The first spacer has a first portion that passes through a hole in the first printed circuit board and a thread portion that screws into the baseplate. The first spacer is arranged around the first portion between the first printed circuit board and a first end of the fastener. The second spacer is arranged around the first portion between the first printed circuit board and the baseplate.

In another feature, the mounting assemblies allow movement of the baseplate along at least one of X, Y, and Z axes while not allowing such movement to transfer to the first printed circuit board.

In another feature, perimeters of the first and second spacers are greater than a perimeter of the hole in the first printed circuit board.

In another feature, a length of the first spacer is less than a distance between the first printed circuit board and the first end of the fastener.

In another feature, a length of the second spacer is less than a distance between the first printed circuit board and the baseplate.

In another feature, the first printed circuit board has a thickness, and a sum of the thickness of the first printed circuit board and lengths of the first and second spacers is less than a length of the first portion of the fastener.

In other features, the fastener includes a shoulder screw. The first portion of the fastener is a shoulder of the shoulder screw. The first printed circuit board has a thickness. A sum of the thickness of the first printed circuit board and lengths of the first and second spacers is less than a shoulder length of the shoulder screw.

In other features, a heating plate including heating elements is arranged on the baseplate. The first printed circuit board includes connections to the heating elements. The mounting assemblies allow expansion of the baseplate along at least one of X, Y, and Z axes due to heat while not allowing such expansion to transfer to the first printed circuit board.

In another feature, the baseplate includes cooling channels, and the mounting assemblies allow contraction of the baseplate along at least one of X, Y, and Z axes due to cooling while not allowing such contraction to transfer to the first printed circuit board.

In another feature, the baseplate includes cooling channels, and the mounting assemblies allow displacement of the baseplate along at least one of X, Y, and Z axes due to heating and cooling while not allowing such displacement to transfer to the first printed circuit board.

In other features, the baseplate includes a heater, and the first printed circuit board comprises a first connector including connections to the heater. The substrate support assembly further comprises a facility plate to receive power from a power supply, and a second printed circuit board fixed to the facility plate. The second printed circuit board includes a second connector that is mated to the first connector to supply the power to the first printed circuit board. The mounting assemblies allow the baseplate to expand along at least one of X, Y, and Z axes due to heat while keeping the second connector mated to the first connector.

In another feature, the baseplate includes cooling channels, and the mounting assemblies allow the baseplate to expand and contract along at least one of X, Y, and Z axes due to heating and cooling while keeping the second connector mated to the first connector.

In still other features, a system comprises a subsystem subjected to at least one of heating and cooling. A first printed circuit board is coupled to the subsystem by a plurality of mounting assemblies and including a first connector. A second printed circuit board is mounted on a fixed object and includes a second connector that is inserted into the first connector. Each mounting assembly includes a fastener, a first spacer, and a second spacer. The fastener has a first portion that passes through a hole in the first printed circuit board and a thread portion that screws into the subsystem. The first spacer is arranged around the first portion between the first printed circuit board and a first end of the fastener. The second spacer is arranged around the first portion between the first printed circuit board and the subsystem. Perimeters of the first and second spacers are greater than a perimeter of the hole in the first printed circuit board. A sum of a thickness of the first printed circuit board and lengths of the first and second spacers is less than a length of the first portion of the fastener.

In another feature, the mounting assemblies allow displacement of the subsystem along at least one of X, Y, and Z axes due to heating and cooling while not allowing such displacement to transfer to the first printed circuit board and while keeping the first and second connectors firmly connected to each other.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
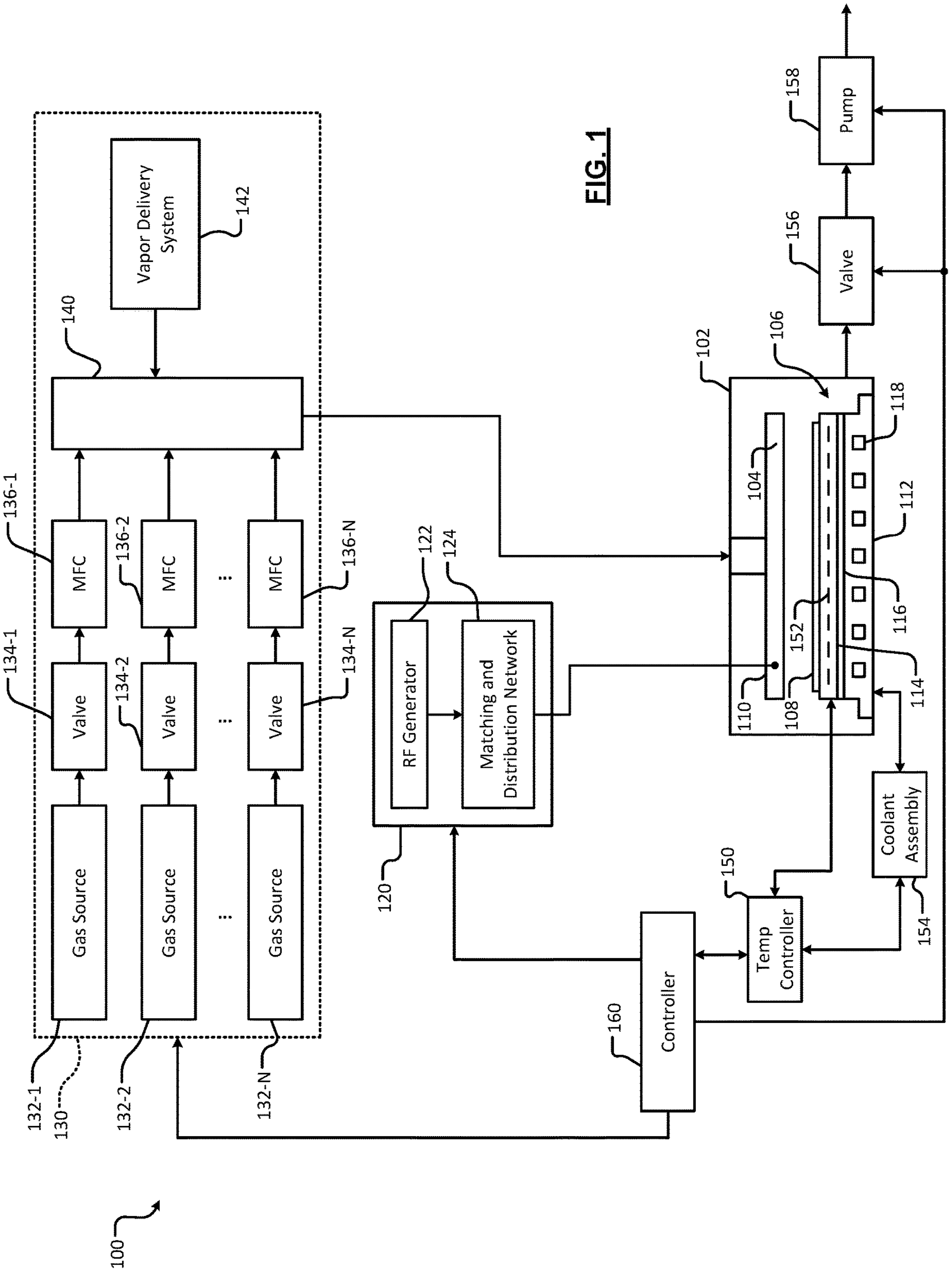
FIG. 1 shows an example of a substrate processing system comprising a processing chamber.

In some substrate processing systems, an electrostatic chuck (ESC) includes a temperature control system to control substrate temperature. For example, the temperature control system may include a main heater, a set of independently controlled micro heaters (e.g., up to 100 or more micro heaters), and a temperature monitoring system including temperature sensors. Additionally, cooling channels are provided in the ESC baseplate through which a coolant is circulated.

Some ESCs use fixed sockets and pins for distributing power to the heaters from a facility plate arranged under the baseplate. These connections have issues due to mechanical resistance experienced during ESC installation/removal. Heater connections are prone to failure due to stress induced by pin/socket friction. In addition to high assembly cost, the ESC and the facility plate have to be redesigned when a single connection is relocated.

In some designs, a first PCB including electrical connections to the heaters and sensors is fixed to the bottom of the ESC. The first PCB provides power and signal distribution hardware for the temperature control system. A second PCB is fixed to the facility plate arranged under the baseplate to interface external power supply and heater control circuits to the first PCB. The second PCB is also called a multiplexer or a MUX PCB. Spring loaded pins are used to provide electrical connections between the two PCBs. The spring loaded pins have limited current and voltage ratings and a high failure rate.

Alternatively, the first PCB can include a connector that mates with a corresponding connector on the second PCB. However, temperature variations due to heating and cooling cycles cause the first PCB to move in X, Y, and Z directions relative to the second PCB. With both the PCBs mounted in fixed positions, the movement stresses the connectors between the first and second PCBs, which can break the connectors and/or the connections between the two PCBs.

The present disclosure provides a mounting system that allows the first PCB to physically float relative to the ESC. The mounting system significantly reduces the stress on the connectors that connect the two PCBs by mechanically floating the first PCB in X, Y, Z directions. The mechanical floating also enables blind mating of the connectors under large positional mismatch, which simplifies the ESC installation/removal process. In addition, the mounting system allows use of connectors with higher voltage and current carrying capacities and provides improved reliability, lower cost, and product extendibility (i.e., allows for design changes without requiring significant redesign) relative to the above designs.

The present disclosure is organized as follows. Initially, an example of a substrate processing system in which the mounting system of the present disclosure can be used is shown and described with reference to FIG. 1. Thereafter, two different ESC designs having respective issues are shown and described with reference to FIGS. 2 and 3. Subsequently, an example of the mounting system according to the present disclosure is shown and described with reference to FIGS. 4-6.

FIG. 1 shows an example of a substrate processing system 100 comprising a processing chamber 102. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching processes. The system 100 comprises the processing chamber 102 that encloses other components of the system 100 and contains an RF plasma (if used). The processing chamber 102 comprises an upper electrode 104 and an electrostatic chuck (ESC) 106 or other substrate support. During operation, a substrate 108 is arranged on the ESC 106.

For example, the upper electrode 104 may include a gas distribution device 110 such as a showerhead that introduces and distributes process gases. The gas distribution device 110 may include a stem portion including one end connected to a top surface of the processing chamber 102. A base portion of the showerhead is generally cylindrical and extends radially outwardly from an opposite end of the stem portion at a location that is spaced from the top surface of the processing chamber 102. A substrate-facing surface or faceplate of the base portion of the showerhead includes a plurality of holes through which vaporized precursor, process gas, or purge gas flows. Alternately, the upper electrode 104 may include a conducting plate, and the process gases may be introduced in another manner.

The ESC 106 comprises a baseplate 112 that acts as a lower electrode. The baseplate 112 supports a heating plate 114, which may correspond to a ceramic multi-zone heating plate. A thermal resistance layer 116 may be arranged between the heating plate 114 and the baseplate 112. The baseplate 112 may include one or more channels 118 for flowing coolant through the baseplate 112.

If plasma is used, an RF generating system 120 generates and outputs an RF voltage to one of the upper electrode 104 and the lower electrode (e.g., the baseplate 112 of the ESC 106). The other one of the upper electrode 104 and the baseplate 112 may be DC grounded, AC grounded, or floating. For example only, the RF generating system 120 may include an RF generator 122 that generates RF power that is fed by a matching and distribution network 124 to the upper electrode 104 or the baseplate 112. In other examples, the plasma may be generated inductively or remotely.

A gas delivery system 130 includes one or more gas sources 132-1, 132-2, . . . , and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. A vapor delivery system 142 supplies vaporized precursor to the manifold 140 or another manifold (not shown) that is connected to the processing chamber 102. An output of the manifold 140 is fed to the processing chamber 102.

A temperature controller 150 may be connected to a plurality of thermal control elements (TCEs) 152 arranged in the heating plate 114. The temperature controller 150 may be used to control the plurality of TCEs 152 to control a temperature of the ESC 106 and the substrate 108. The temperature controller 150 may communicate with a coolant assembly 154 to control coolant flow through the channels 118. For example, the coolant assembly 154 may include a coolant pump, a reservoir, and one or more temperature sensors (not shown). The temperature controller 150 operates the coolant assembly 154 to selectively flow the coolant through the channels 118 to cool the ESC 106. A valve 156 and pump 158 may be used to evacuate reactants from the processing chamber 102. A system controller 160 controls the components of the system 100.

Figure 2:
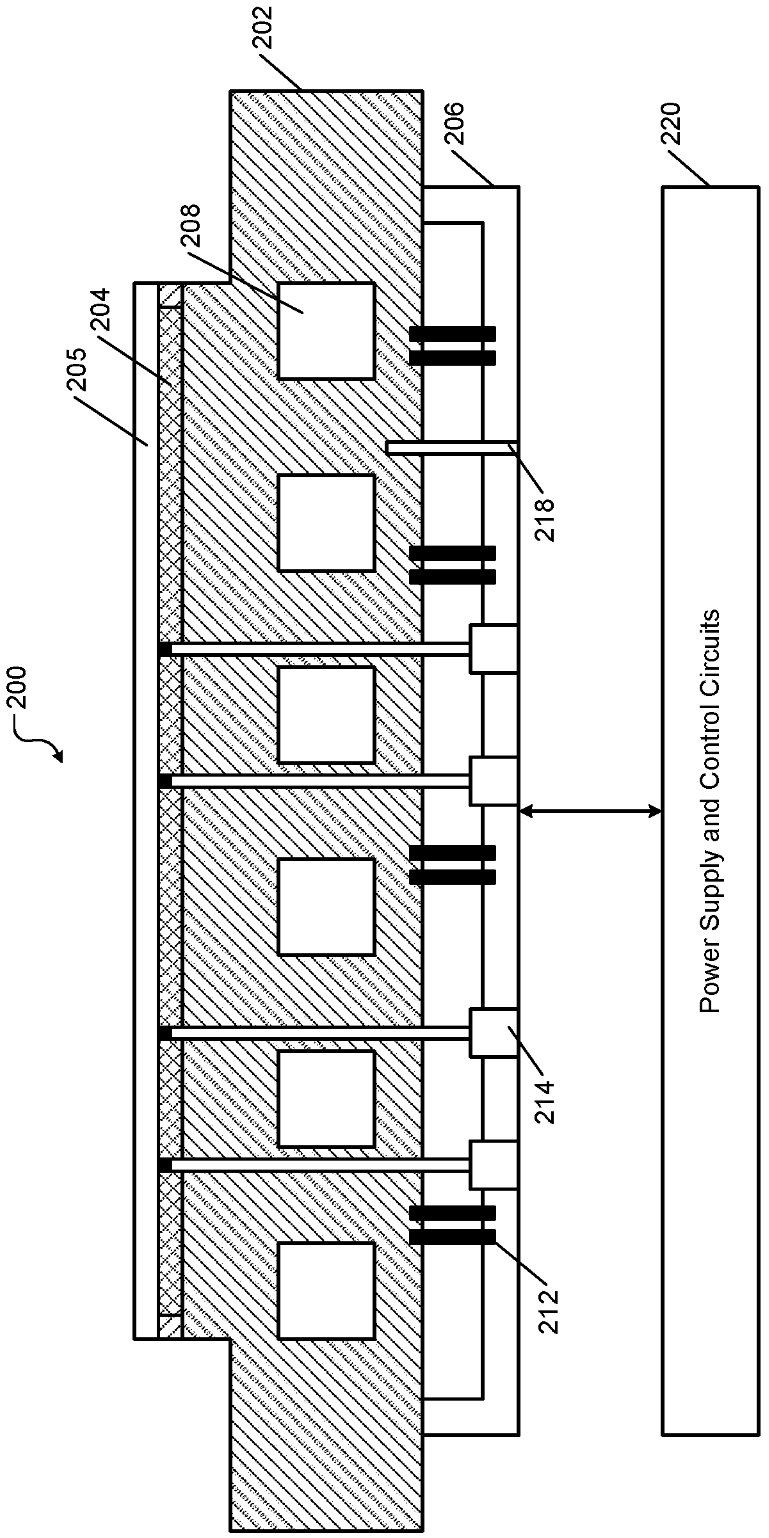
FIG. 2 is a side cross-sectional view of an example of a substrate support assembly that does not include a printed circuit board.

FIG. 2 shows a first ESC design that does not use any PCBs. In the first design, an ESC 200 comprises a baseplate 202, a heating plate 204, a ceramic layer 205, and a facility plate 206. The baseplate 202 includes a plurality of cooling channels 208. The heating plate 204 includes a main heater and a plurality of micro heaters (e.g., elements 152 shown in FIG. 1).

A plurality of heater terminals 212 are connected to the heaters in the heating plate 204. The heater terminals 212 extend from the bottom of the baseplate 202 and mate with connections provided on the facility plate 206 to provide power to the heaters. A plurality of temperature probes 214 extend from the facility plate 206, through the base plate 202, to the ceramic layer 205 to sense the temperature of the ceramic layer 205. A temperature probe 218 extends from the facility plate 206 into the base plate 202 to sense the temperature of the baseplate 202.

A power supply and control circuit 220, which is external to and remote from the ESC 200, supplies power to the facility plate 206. The facility plate 206 supplies the power to the heaters in the heating plate 204. The facility plate 206 supplies signals from the temperature probes 214, 218 to the power supply and control circuit 220. The power supply and control circuit 220 controls the power supplied to the heaters in the heating plate 204 and the flow of coolant through the cooling channels 208 based on the signals from the temperature probes 214, 218 received from the facility plate 206.

In this design, the heater terminals 212 have alignment issues during ESC installation and are prone to failure due to stress. The temperature probes 214, 218 are prone to damage during ESC installation. Further, the design is not extendible; that is, if a single connection is altered, the entire structure needs to be redesigned.

Figure 3:
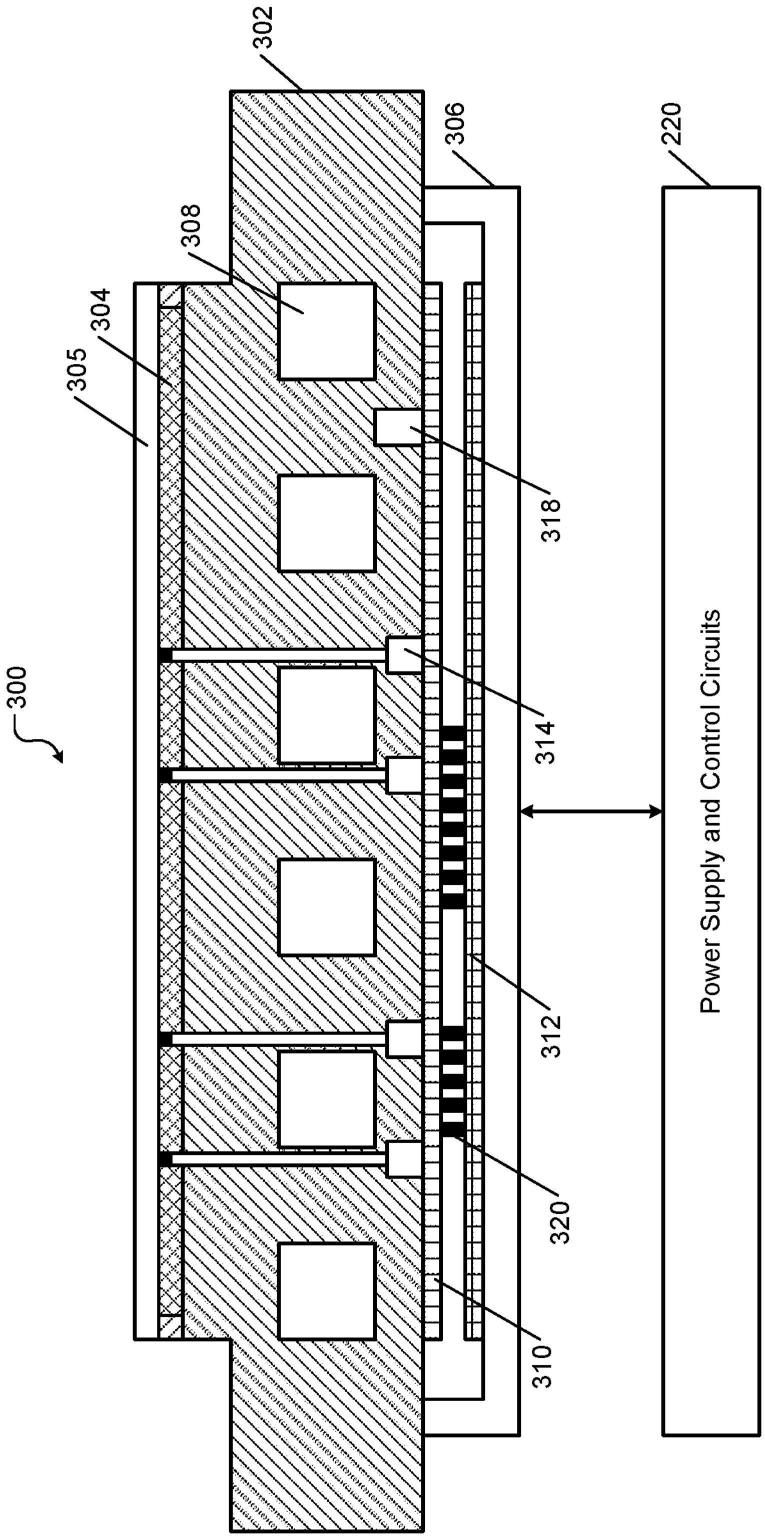
FIG. 3 is a side cross-sectional view of another example of a substrate support assembly that includes a printed circuit board fixed to a baseplate of the substrate support assembly.

FIG. 3 shows a second ESC design that uses PCBs fixed to the ESC and the facility plate. In the second design, an ESC 300 comprises a baseplate 302, a heating plate 304, a ceramic layer 305, and a facility plate 306. The baseplate 302 includes a plurality of cooling channels 308. The heating plate 304 includes a main heater and a plurality of micro heaters (e.g., elements 152 shown in FIG. 1).

A first PCB 310 is fixed to the bottom of the baseplate 302. A second PCB 312 is fixed to the facility plate 306. The first PCB 310 includes electrical connections to the heaters and sensors and includes power and signal distribution hardware. The second PCB 312 interfaces with the first PCB 310 and is also called a multiplexer or a MUX PCB. The second PCB 312 is connected to the power supply and control circuit 220.

Unlike in the first design, a plurality of temperature probes 314 that sense the temperature of the ceramic layer 305 are arranged in the baseplate 302. A temperature probe 318 that senses the temperature of the baseplate 302 is also arranged in the baseplate 302. The first PCB 310 fixed to the bottom of the baseplate 302 includes connections to the temperature probes 314, 318.

The power supply and control circuit 220 supplies power to the second PCB 312. The first PCB 310 receives the power from the second PCB 312 and supplies the power to the heaters in the heating plate 304. The first PCB 310 receives signals from the temperature probes 314, 318. The second PCB 312 receives the signals from the first PCB 310 and supplies the signals to the power supply and control circuit 220. The power supply and control circuit 220 controls the power to the heaters in the heating plate 304 and the flow of coolant through the cooling channels 308 based on the signals from the temperature probes 314, 318.

The first PCB 310 and the second PCB 312 are connected to each other by a plurality of spring loaded pin connections (e.g., pogo pins) 320. The pin connections 320 are arranged on the second PCB 312. The first PCB 310 includes a plurality of pads (not shown). The tips of the pin connections 320 contact the corresponding pads on the first PCB 310.

Since the pin connections 320 are spring loaded, the pin connections 320 accommodate (i.e., tolerate) a relatively small amount of movement of the first PCB 310 in X, Y, and Z direction due to the expansion and contraction of the baseplate 302 caused by heating and cooling cycles. However, due to a single point of contact between a tip of a pin connection and a pad, the pin connections 320 cause arcing at relatively high power levels, which can damage the first and second PCBs 310, 312. Further, the pin connections 320, being spring loaded, can also get stuck and have a high failure rate as a result.

Figure 4:
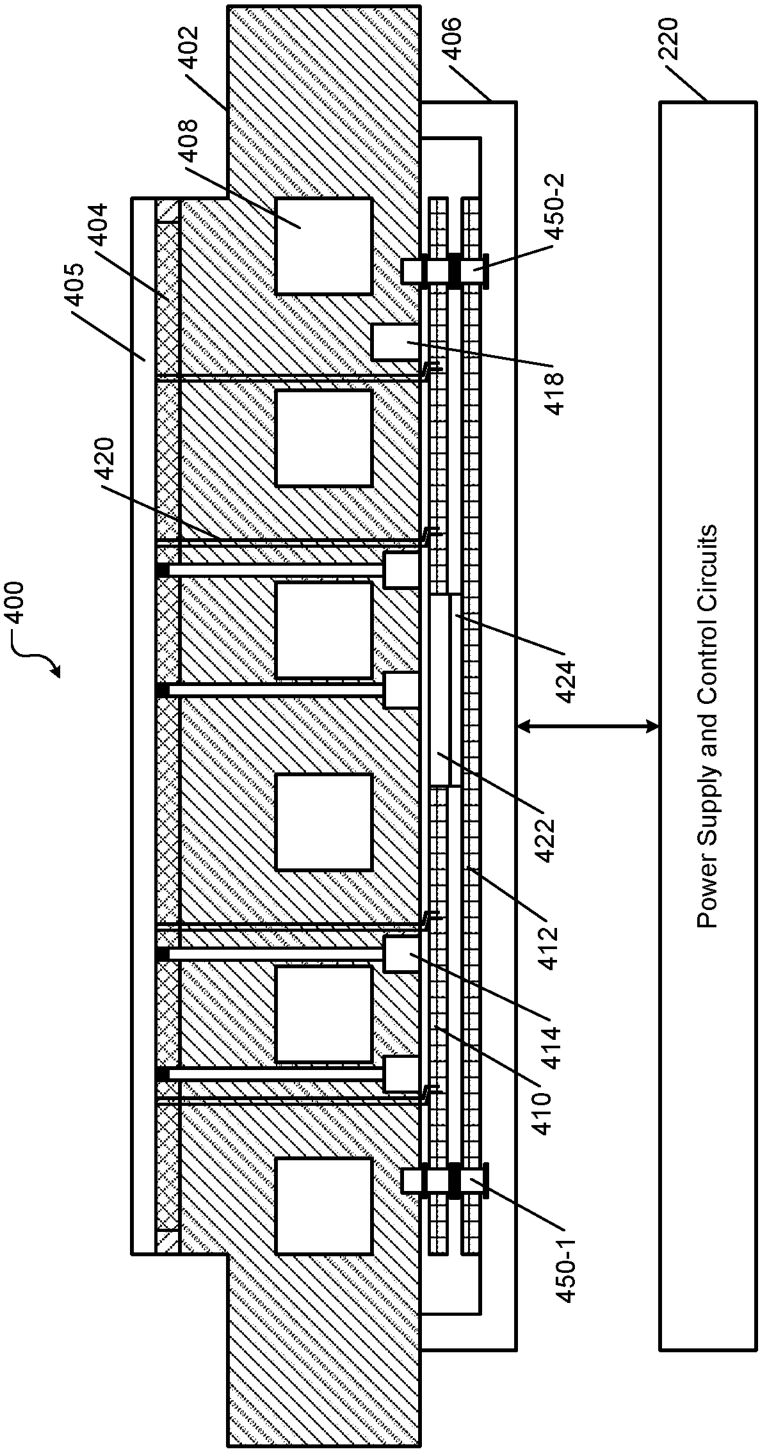
FIG. 4 is a side cross-sectional view of another example of a substrate support assembly in which the printed circuit board is coupled to the baseplate using a mounting system according to the present disclosure.

FIG. 4 shows an ESC design according to the present disclosure. An ESC 400 comprises a baseplate 402, a heating plate 404, a ceramic layer 405, and a facility plate 406. The baseplate 402 includes a plurality of cooling channels 408. The heating plate 404 includes a main heater and a plurality of micro heaters (e.g., elements 152 shown in FIG. 1).

A first PCB 410 includes electrical connections to the heaters and sensors and includes power and signal distribution hardware. The first PCB 410 is not fixed to the bottom of the baseplate 402. Instead, the first PCB 410 is coupled to the bottom of the baseplate 402 using a mounting system that allows the first PCB 410 to float relative to the baseplate 402. The mounting system comprises a plurality of shoulder screws and spacers generally shown at 450-1 and 450-2 (collectively called the mounting system 450). The mounting system 450 is described below in detail with reference to FIGS. 5 and 6.

A second PCB 412 is fixed to the facility plate 406. The second PCB 412 interfaces with the first PCB 410 and is also called a multiplexer or a MUX PCB. The second PCB 412 is connected to the power supply and control circuit 220.

A plurality of temperature probes 414 that sense the temperature of the ceramic layer 405 are arranged in the baseplate 406. A temperature probe 418 that senses the temperature of the baseplate 402 is also arranged in the baseplate 406. The first PCB 410 includes connections to the temperature probes 414, 418. The first PCB 410 also includes connections 420 to the heaters in the heating plate 404.

The power supply and control circuit 220 supplies power to the second PCB 412. The first PCB 410 receives the power from the second PCB 412 and supplies the power to the heaters in the heating plate 304. The first PCB 410 receives signals from the temperature probes 314, 318. The second PCB 412 receives the signals from the first PCB 410 and supplies the signals to the power supply and control circuit 220. The power supply and control circuit 220 controls the power to the heaters in the heating plate 404 and the flow of coolant through the cooling channels 408 based on the signals from the temperature probes 414, 418.

The first PCB 410 includes a first connector 422 that includes power and signal connections for the heaters in the heating plate 404 and the temperature probes 414, 418 in the baseplate 402. The second PCB 312 includes a second connector 424 that includes connections to interface with the first PCB 410, supply power and control signals from the power supply and control circuit 220 to the heaters in the heating plate 404, and supply the signals from the temperature probes 414, 418 to the power supply and control circuit 220. The first connector 422 mates with the second connector 424 firmly to ensure firm contact with the first and second PCBs 410, 412.

Figure 5:
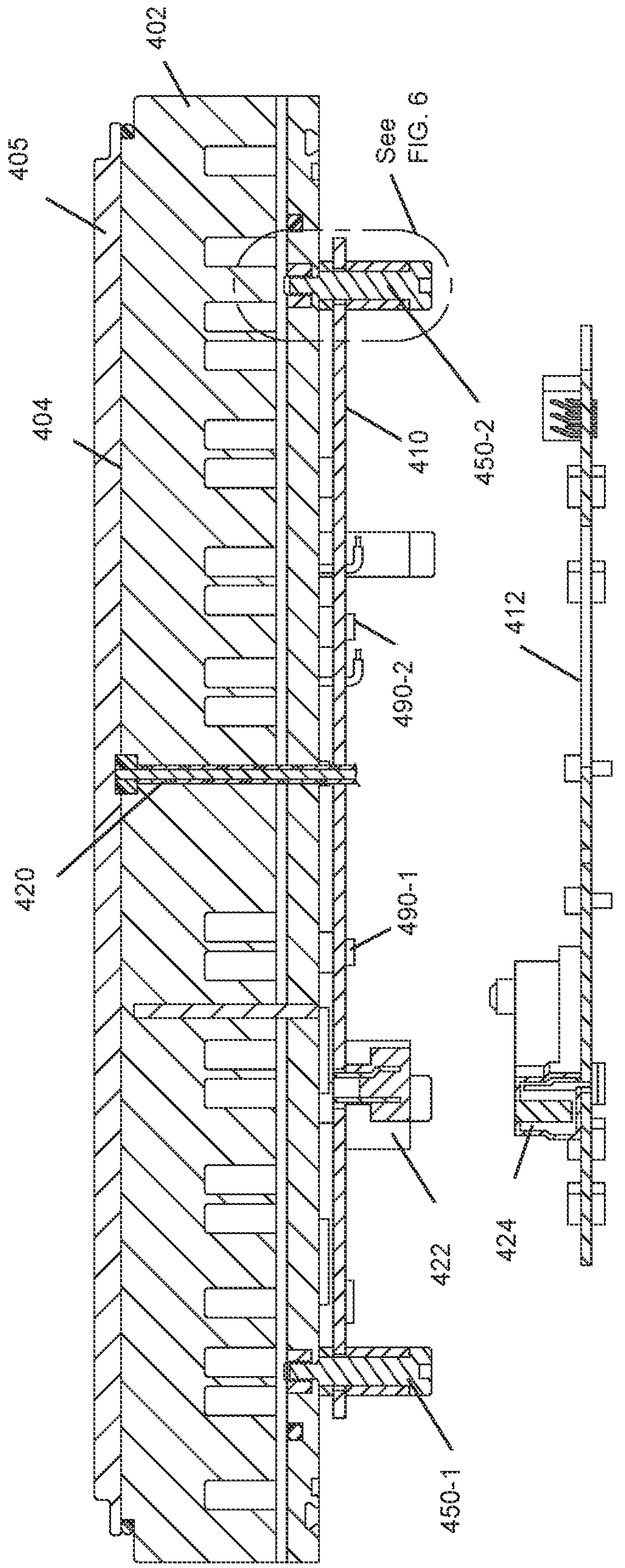
FIG. 5 shows an example of the substrate support assembly of FIG. 4.

FIG. 5 shows an example of the ESC 400 and the mounting system 450. Only some of the elements of the ESC 400 described above with reference to FIG. 4 are shown. The first and second PCBs 410, 412 are shown disengaged. The first PCB 410 physically floats relative to the baseplate 402 due to the design of the elements 450-1, 450-2, which is explained below in detail with reference to FIG. 6. When the baseplate 402 expands or contracts in the X, Y, Z, directions, the resultant displacement of the baseplate 402 is not transferred to the first PCB 410 due to the design of the elements 450-1, 450-2. Therefore, when the second PCB 412 is connected to the first PCB 410, their connectors 424, 422 remain firmly engaged and are unaffected by the displacement of the baseplate 402 as explained below in detail.

Figure 6:
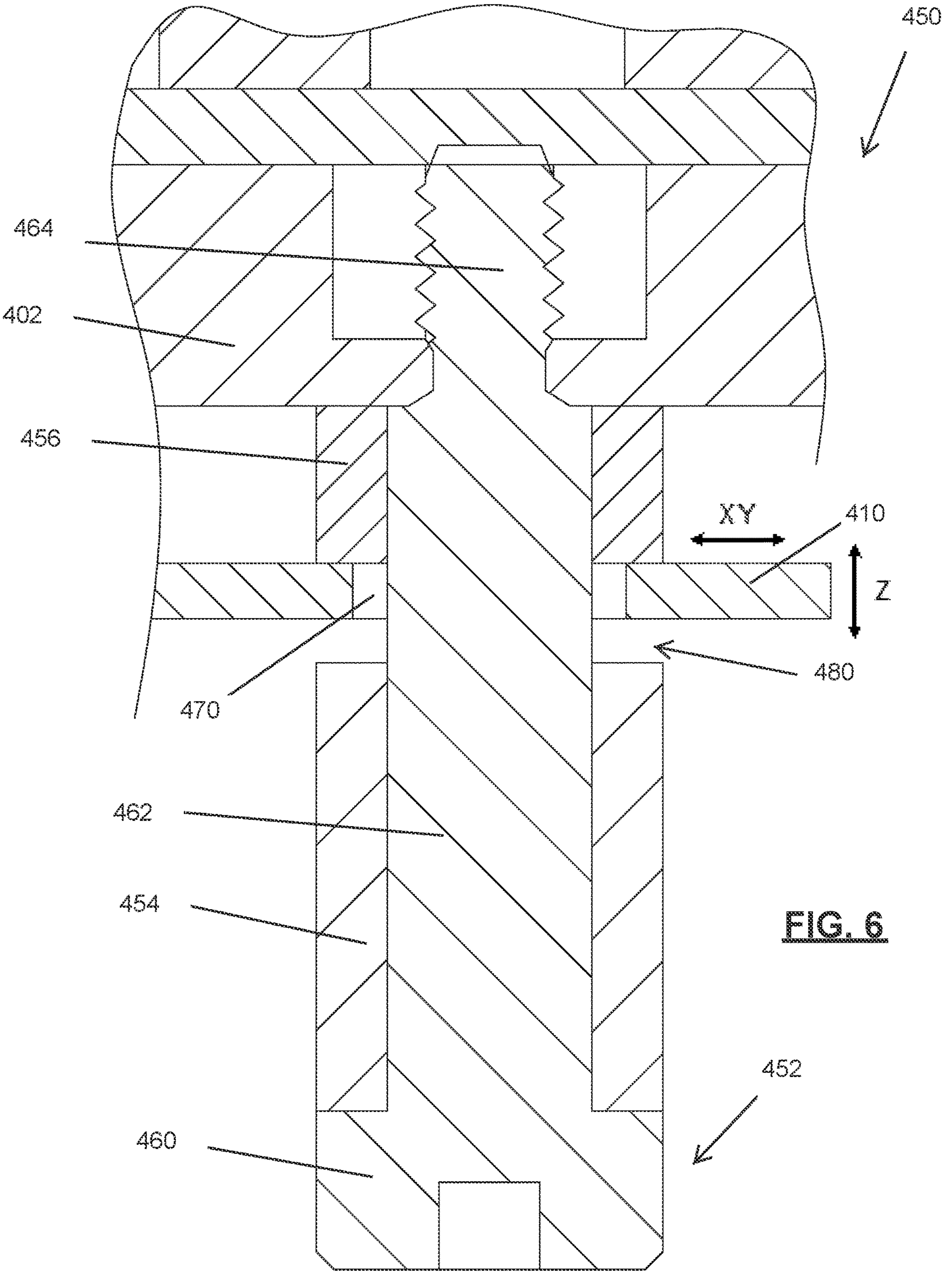
FIG. 6 shows an example of the mounting system of FIG. 4.

FIG. 6 shows the mounting system 450 in further detail. The mounting system 450 comprises a plurality of mounting assemblies. Each mounting assembly comprises a shoulder screw 452, a first spacer 454, and a second spacer 456. The shoulder screw 452 has a head 460, a shoulder 462, and a thread 464. The first PCB 410 includes a plurality of holes 470 (only one shown) through which the shoulder screws 452 pass and screw into the baseplate 402. The diameter of the holes 470 is greater than the shoulder diameter (i.e., diameter of the shoulder 462) of the shoulder screws 452. The shoulder 462 passes through the hole 470, and the thread 464 screws into the bottom of the baseplate 402.

In each mounting assembly, the first and second spacers 454, 456 have inner diameters that are approximately equal to the shoulder diameter (i.e., the diameter of the shoulder 462) of shoulder screw 452. The outer diameters of the first and second spacers 454, 456 are greater than the diameter of the hole 470 in the first PCB 410. The first spacer 454 is arranged between the head 460 and the bottom side of the first PCB 410. The second spacer 456 is arranged between the bottom of the baseplate 402 and the top side of the first PCB 410.

The lengths of each of the first and second spacers 454, 456 is less than the shoulder length (i.e., the length of the shoulder 462) of shoulder screw 452. The length of the first spacer 454 is selected such that a small gap 480 exists between the first spacer 454 and the bottom side of the first PCB 410. There is no gap between the second spacer 456 and each of the bottom of the baseplate 402 and the top side of the first PCB 410. Accordingly, a sum of the thickness of the first PCB and the lengths of the first and second spacers 454, 456 is less than the shoulder length of the shoulder screw 452.

Alternatively, a gap may be arranged between the second spacer 456 and the top side of the first PCB 410, in which case, no gap exists between the first spacer 454 and the bottom side of the first PCB 410. Again, the sum of the thickness of the first PCB and the lengths of the first and second spacers 454, 456 is less than the shoulder length of the shoulder screw 452. The shoulder length of the shoulder screw 452 and the lengths of the first and second spacers 454, 456 may be selected depending on the amount of separation (distance) necessary between the bottom of the baseplate 402 and the top side of the first PCB 410.

The above design floats the first PCB 410 in the X, Y, and Z directions as follows. Since the diameter of the hole 470 is greater than the shoulder diameter, the gap between the shoulder 462 and the hole 470 allows the first PCB 410 to float in the X and Y directions. That is, when the baseplate 402 expands or contracts in the X and Y directions, the displacement of the baseplate in the X and Y directions is accommodated by the gap and is not transferred to the first PCB 410. Since the first PCB 410 is not fixed to the baseplate 402, the first PCB 410 does not move with the baseplate 402 when the baseplate 402 expands or contracts in the X and Y directions. Therefore, when the second PCB 412 is connected to the first PCB 410, their connectors 424, 422 remain firmly engaged and are unaffected by the displacement of the baseplate 402 in the X and Y directions. The shape of the gap may vary depending on the shape of the shoulder 462. In the case where the shoulder 462 is cylindrical, the gap would resemble an annular ring.

Further, the gap 480 between the first spacer 454 and the bottom side of the first PCB 410 allows the first PCB 410 to float in the Z direction. That is, when the baseplate 402 can expand or contract in the Z direction, the displacement of the baseplate in the Z direction is accommodated by the gap 480 and is not transferred to the first PCB 410. Since the first PCB 410 is not fixed to the baseplate 402, the first PCB 410 does not move with the baseplate 402 when the baseplate 402 expands or contracts in the Z direction. The same result obtains if instead a gap is arranged between the second spacer 456 and the top side of the first PCB 410. Therefore, when the second PCB 412 is connected to the first PCB 410, their connectors 424, 422 remain firmly engaged and are unaffected by the displacement of the baseplate 402 in the Z direction. Thus, the mounting assemblies allow the baseplate 402 to expand and contract along at least one of X, Y, and Z axes due to heating and cooling while keeping the first PCB 410 stationary relative to such expansion or contraction.

In FIG. 5, a plurality of guide posts 490-1, 490-2 extending from the bottom of the baseplate 402 are shown. The first PCB 410 has corresponding holes that align with these guide posts 490-1, 490-2. The guide posts 490-1, 490-2 ensure that the first PCB 410 is oriented correctly when the first PCB 410 is coupled to the baseplate 402 using the mounting system 450. The holes in the first PCB 410 that align with the guide posts 490-1, 490-2 have diameters that do not defeat the operation of the mounting system 450. For example, the diameters of these holes are large enough such the movement of the guide posts 490-1, 490-2 is not obstructed when the baseplate 402 expands or contracts in the X, Y, Z directions. The guide posts 490-1, 490-2 do not contact the first PCB 410 when the baseplate 402 expands or contracts in the X, Y, Z directions.

Shoulder screws are used only as examples to describe the mounting system of the present disclosure. Other fasteners providing the described functionality can be used instead. Further, the elements 452, 454, 456 of the mounting assemblies are shown and described as being cylindrical in shape for example only. Elements having other shapes (non-limiting examples include square, rectangular, hexagonal, oval, etc.) may be used instead. Correspondingly, the holes 470 in the first PCB 410 may also have other than circular shapes.

Further, the teachings of the present disclosure are not limited to substrate processing systems. The teachings can be applied to other systems or subsystems comprising or proximate to heating and/or cooling elements that cause the subsystem to expand and/or contract, where a first PCB needs to be coupled to the subsystem and needs to be connected to a second fixed PCB. Keeping the first PCB physically floating relative to the subsystem using the mounting assemblies of the present disclosure can eliminate stress on connectors connecting the first and second PCBs.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another are within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support assembly comprising:

a baseplate to support at least one layer to be disposed thereon; and a first printed circuit board coupled to the baseplate by a plurality of mounting assemblies that allow the baseplate to move relative to the first printed circuit board;

wherein each mounting assembly comprises:

a fastener having a first portion that passes through a hole in the first printed circuit board and a thread portion that screws into the baseplate;

a first spacer arranged around the first portion between the first printed circuit board and a first end of the fastener; and a second spacer arranged around the first portion between the first printed circuit board and the baseplate.

2. The substrate support assembly of claim 1 wherein the mounting assemblies allow displacement of the baseplate relative to the first printed circuit board without transferring such displacement to the first printed circuit board.

3. The substrate support assembly of claim 1 wherein:

the baseplate comprises a plurality of heaters; and wherein the mounting assemblies allow expansion of the baseplate along at least one of X, Y, and Z axes due to heat while not allowing such expansion to transfer to the first printed circuit board.

4. The substrate support assembly of claim 1 wherein:

the baseplate comprises a plurality of cooling channels; and wherein the mounting assemblies allow contraction of the baseplate along at least one of X, Y, and Z axes due to cooling while not allowing such contraction to transfer to the first printed circuit board.

5. The substrate support assembly of claim 1 wherein:

the baseplate comprises a plurality of heaters and cooling channels; and wherein the mounting assemblies allow displacement of the baseplate along at least one of X, Y, and Z axes due to heating and cooling while not allowing such displacement to transfer to the first printed circuit board.

6. The substrate support assembly of claim 1 further comprising:

a second printed circuit board fixed to a facility plate and connected to the first printed circuit board, wherein the mounting assemblies allow the baseplate to move while keeping the first and second printed circuit boards stationary relative to each other.

7. The substrate support assembly of claim 1 wherein the mounting assemblies allow movement of the baseplate along at least one of X, Y, and Z axes while not allowing such movement to transfer to the first printed circuit board.

8. The substrate support assembly of claim 1 wherein perimeters of the first and second spacers are greater than a perimeter of the hole in the first printed circuit board.

9. The substrate support assembly of claim 1 wherein a length of the first spacer is less than a distance between the first printed circuit board and the first end of the fastener.

10. The substrate support assembly of claim 1 wherein a length of the second spacer is less than a distance between the first printed circuit board and the baseplate.

11. The substrate support assembly of claim 1 wherein:
the first printed circuit board has a thickness; and
a sum of the thickness of the first printed circuit board and lengths of the first and second spacers is less than a length of the first portion of the fastener.

12. The substrate support assembly of claim 1 wherein:
the fastener includes a shoulder screw, the first portion of the fastener being a shoulder of the shoulder screw;
the first printed circuit board has a thickness; and
a sum of the thickness of the first printed circuit board and lengths of the first and second spacers is less than a shoulder length of the shoulder screw.

13. The substrate support assembly of claim 1 further comprising:
a heating plate arranged on the baseplate, the heating plate including heating elements;
wherein the first printed circuit board includes connections to the heating elements; and
wherein the mounting assemblies allow expansion of the baseplate along at least one of X, Y, and Z axes due to heat while not allowing such expansion to transfer to the first printed circuit board.

14. The substrate support assembly of claim 13 wherein:
the baseplate includes cooling channels; and
wherein the mounting assemblies allow displacement of the baseplate along at least one of X, Y, and Z axes due to heating and cooling while not allowing such displacement to transfer to the first printed circuit board.

15. The substrate support assembly of claim 1 wherein:
the baseplate includes cooling channels; and
wherein the mounting assemblies allow contraction of the baseplate along at least one of X, Y, and Z axes due to cooling while not allowing such contraction to transfer to the first printed circuit board.

16. The substrate support assembly of claim 1 wherein the baseplate includes a heater and the first printed circuit board comprises a first connector including connections to the heater, the substrate support assembly further comprising:
a facility plate to receive power from a power supply; and
a second printed circuit board fixed to the facility plate and including a second connector that is mated to the first connector to supply the power to the first printed circuit board,
wherein the mounting assemblies allow the baseplate to expand along at least one of X, Y, and Z axes due to heat while keeping the second connector mated to the first connector.

17. The substrate support assembly of claim 16 wherein:
the baseplate includes cooling channels; and
the mounting assemblies allow the baseplate to expand and contract along at least one of X, Y, and Z axes due to heating and cooling while keeping the second connector mated to the first connector.

18. A system comprising:
a subsystem subjected to at least one of heating and cooling;
a first printed circuit board coupled to the subsystem by a plurality of mounting assemblies and including a first connector;
a second printed circuit board mounted on a fixed object and including a second connector that is inserted into the first connector;
wherein each mounting assembly includes:
a fastener having a first portion that passes through a hole in the first printed circuit board and a thread portion that screws into the subsystem;
a first spacer arranged around the first portion between the first printed circuit board and a first end of the fastener; and
a second spacer arranged around the first portion between the first printed circuit board and the subsystem,
wherein perimeters of the first and second spacers are greater than a perimeter of the hole in the first printed circuit board, and
wherein a sum of a thickness of the first printed circuit board and lengths of the first and second spacers is less than a length of the first portion of the fastener.

19. The system of claim 18 wherein the mounting assemblies allow displacement of the subsystem along at least one of X, Y, and Z axes due to heating and cooling while not allowing such displacement to transfer to the first printed circuit board and while keeping the first and second connectors firmly connected to each other.

* * * * *